United States Patent [19]

Fraas et al.

[11] Patent Number: 4,829,021
[45] Date of Patent: May 9, 1989

[54] PROCESS FOR VACUUM CHEMICAL EPITAXY

[75] Inventors: Lewis M. Fraas, El Sobrante; Paul S. McLeod, Berkeley; John A. Cape, San Rafael, all of Calif.

[73] Assignee: Daido Sanso K.K., Osaka, Japan

[21] Appl. No.: 130,582

[22] Filed: Dec. 9, 1987

Related U.S. Application Data

[62] Division of Ser. No. 941,005, Dec. 12, 1986.

[51] Int. Cl.$^4$ .................. H01L 21/203; H01L 21/205
[52] U.S. Cl. ........................... 437/81; 148/DIG. 65; 148/DIG. 110; 148/DIG. 169; 148/DIG. 57; 156/612; 357/16; 357/23.2; 437/39; 437/107; 437/126; 437/133; 437/912; 437/946
[58] Field of Search .................. 148/DIG. 56, 57, 65, 148/72, 110, 139, 169; 156/610–615; 357/16, 23.2; 437/39, 41, 22, 81, 85, 105, 107, 126, 133, 912, 946

[56] References Cited

U.S. PATENT DOCUMENTS 4,330,360 5/1982 Kubiak et al. ...................... 156/610
4,636,268 1/1987 Tsang ................................ 156/611

OTHER PUBLICATIONS

Fraas et al., "Epitaxial Growth From Oranometallic Sources in High Vacuum", J. Vac. Sci. Technol., B4(1), Jan./Feb. 1986, pp. 22–29.
Fraas et al., "Epitaxial Films Grown by Vacuum MOCVD," J. Crystal Growth, vol. 68, 1984, pp. 490–496.
Fraas, "A New Low Temperature III-V... Vacumm Metalorganic Chemical Vapor Deposition," J. Appl. Phys., 52(11), Nov. 1981, pp. 6939–6943.

Primary Examiner—Brian E. Heavn
Assistant Examiner—William D. Bunch
Attorney, Agent, or Firm—Armstrong, Nikaido, Marmelstein, Kubovcik & Murray

[57] ABSTRACT

An injection block having a plurality of geometrically arranged injection sources for gaseous Group III metal organic compounds is oriented substantially perpendicular to the placement of at least one semiconductor wafer substrate within a vacuum reaction chamber. The injector sources are sized to provide disbursing flow of the compounds capable of depositing a layer of about 5% uniform thickness or less over substantially the entire semiconductor wafer. An injection source of Group V compounds is located centrally within the geometrically arranged injection sources for the Group III compounds. The Group V injection source is sized to supply an excess of the Group V compounds required to react with the Group III compounds in order to form Group III-V semiconductor layers on the substrate and partition the Group III sources into groups having substantially equal numbers of injection sources. An excess of Group V comounds is injected. The vacuum within the reaction chamber is adjusted at predetermined flow rates of the Group III compounds such that a mean-free path of the Group III compounds is greater than the distance from the injection source of the Group III compounds to the substrate. The substrate is heated to a temperature to which a reaction proceeds. The unreacted Group III compounds are exhausted from the vacuum chamber adjacent the edges of a substrate holder facing the top of the chamber opposite to the injection sources. In this manner, the disbursing flow of Group III compounds from the geometric arrangement of sources uniformly overlaps substantially the entire substrate and the algebraic sum of the fluxes from the Group III compound sources remains constant across the area of the substrate upon which the layer is to be deposited.

9 Claims, 2 Drawing Sheets

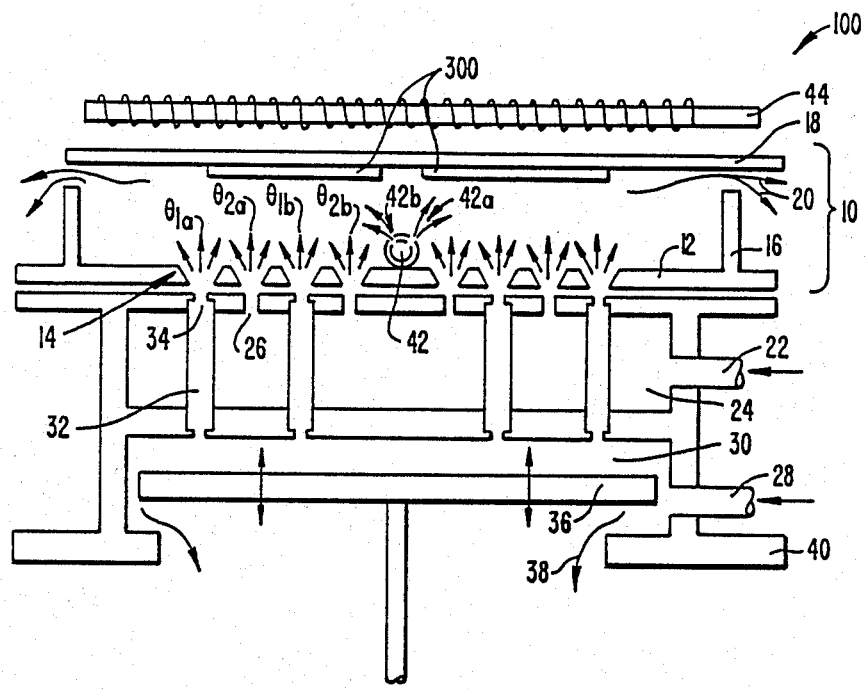
FIG._1.
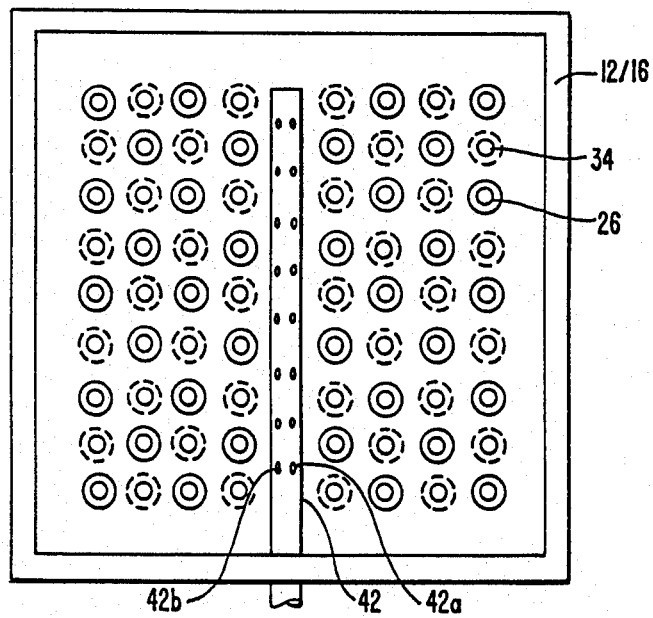
FIG._2.

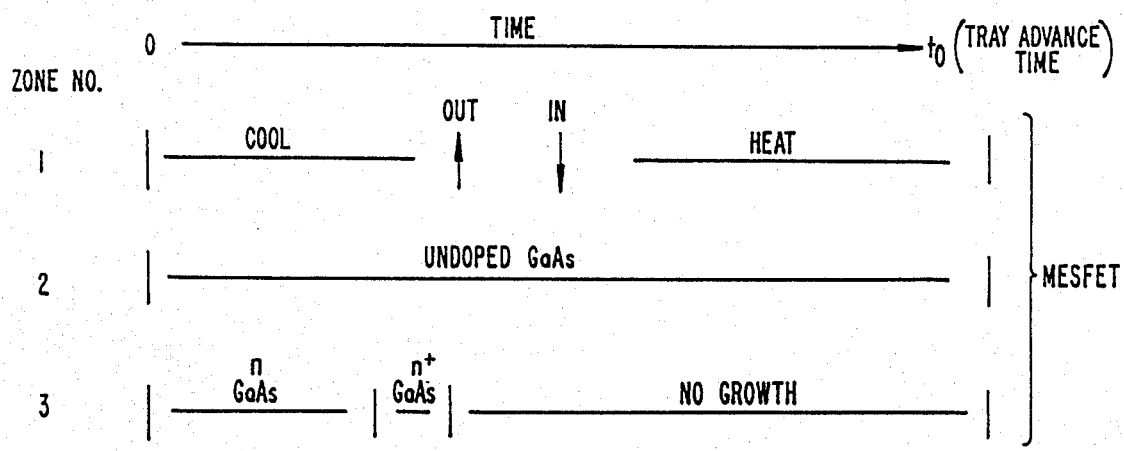
FIG._3.
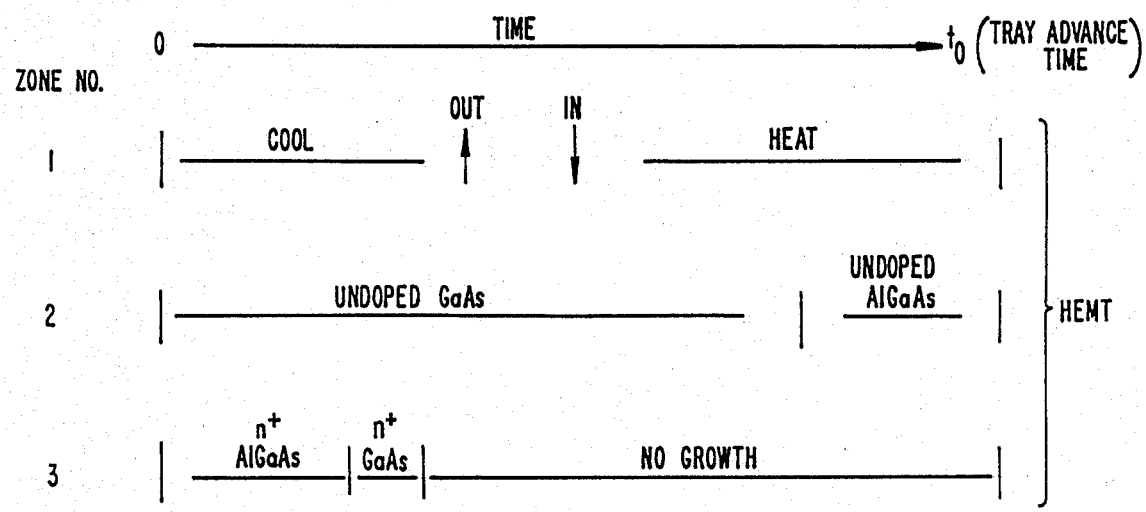
FIG._4.

PROCESS FOR VACUUM CHEMICAL EPITAXY

This is a division, of application Ser. No. 941,005 filed Dec. 12, 1986.

FIELD OF THE INVENTION

This invention relates to the growth of semiconductor layers. More specifically, this invention relates to the growth of Group III-V compound semiconductor layers by vacuum chemical epitaxy. In particular, the invention relates to an improved apparatus and process of growing uniform Group III-V compound semiconductor layers, such as gallium arsenide and aluminum gallium arsenide on large area wafers, i.e., greater than about one inch, through the use of vacuum chemical epitaxial deposition.

BACKGROUND OF THE INVENTION

In recent years, theoretically tantalizing enhancements in performance of Group III-IV compound, e.g., GaAs, semiconductor devices over silicon semiconductor devices spurred the development of this area of technology. However, the two main forms of synthesis processes utilized in this field present potential impediments to the rapid commercialization of this technology. Molecular beam epitaxial systems, (MBE), are not easily scalable to meet the needs of the growing Group III-V compound semiconductor device market. The MBE process presents special limitations for the expansion of the concentrator solar cell market because of the large scale quantities needed to effectively compete with conventional solar cells.

Metal organic chemical vapor deposition systems, (MOCVD), have much higher production capacities. However, the MOCVD process suffers from a poor utilization efficiency of the expensive and toxic reactant gases. In addition, large scale utilization of MOCVD systems would present difficult disposal problems for the highly toxic reaction gases now used in the fabrication process. Furthermore, the amount of reaction gases required in the fabrication process renders the technique very expensive except for specialized applications where cost competiveness with silicon technology is not a major consideration.

We have previously described a technique named vacuum chemical epitaxy (VCE) as vacuum metal-organic-chemical-vapor-deposition at the "Space Photovoltaic Research and Technology Conference" Apr. 30-May 2, 1985. The proceedings were later published in greater detail in a paper titled "Vacuum MOCVD Fabrication of High Efficiency Cells for Multijunction Applications". The VCE technique is scalable and provides for a much higher utilization rate while minimizing the disposal problems of the toxic gases not utilized in the fabrication process. The technique was amplified upon in the Mar. 1, 1984 to Mar. 31, 1985 annual report, forwarded to SERI on July 15, 1985, titled "Research on Multibandgap Solar Cells" for SERI contract ZL-4-03123-1. FIGS. 29 and 31 illustrated a two-nozzle injection system and a multichamber reactor, respectively.

The Apr. 1-30, 1985 informal monthly communication to SERI under contract ZL-4-03123-1 addressed a seven-injection nozzle reactor chamber. More recently, this earlier work was summarized in a paper titled "Epitaxial Growth From Organometallic Sources in High Vacuum", J. Vac. Sci. Technol. B4(1), January/February 1986, pp. 22-29. The figures alone in the J. Vac. Sci. Technology paper were presented earlier at the Electronic Materials Conference on June 19, 1985.

Additionally, the VCE process utilizing reactive gases to enable the fabrication of devices using carbon as a dopant, is described in U.S. Application Ser. No. 885,898, filed July 14, 1986. The above-mentioned application and articles are completely incorporated herein by reference for all purposes.

In spite of these publications, an improved scale-up reactor and fabrication process have not heretofore been disclosed. Thus, it would also be desirable to have an apparatus and a process which can be extended to the general use of any reactive metal organic gas and dopants in a vacuum environment to optimize the growth of uniform semiconductor layers on large area substrates while minimizing the disposal problems of the toxic reactant gases and the reaction by-products.

SUMMARY OF THE INVENTION

The invention is an improved apparatus and process of fabricating Group III-V compound semiconductor layer(s) on substrates. The process also includes the procedures for optimizing the uniformity of the semiconductor layer(s) grown in a vacuum environment irrespective of the reaction gases selected and specific processes of fabricating MESFET and HEMT semiconductor devices.

BRIEF DESCRIPTION OF THE FIGURES

FIG. 1 illustrates an embodiment of the invention for obtaining uniform semiconductor layers grown fro organometallic reactants.

FIG. 2 illustrates a top view of gas injection portion of the apparatus in FIG. 1 for growing Group III-V compound semiconductor layers on a plurality of semiconductor wafers at the same time.

FIG. 3 illustrates a process for fabricating III-V compound MESFET device structure.

FIG. 4 illustrates a process for growing Group III-V compound HEMT device structures.

DETAILED DESCRIPTION OF THE INVENTION

The invention will be more clearly illustrated by referring to the FIGS. 1 and 2 which generally illustrate an apparatus 100 which embodies the broad concepts of our invention.

The apparatus 100 has a reaction chamber 10 defined by a base plate 12, walls 16 and substrate holder and top plate 18. The substrates are illustrated as 300 on top plate 18. The top plate 18 can be fixed or rotatable if a multichamber growth apparatus is required. The chamber 10 includes exhaust ports 20 in the walls 16 adjacent top plate 18. Preferably, the exhaust ports area is about 4% of the deposition area of the chamber. If the chamber is round, then the exhaust ports 20 are really tubular gaps between the edges to the wall 16 and the top plate 18. Generally, as the ratio increased above 4%, the arsine is less uniformly distributed and the uniformity of the semiconductor layer suffers. As the ratio decreased below 4%, there is poorer Group III compound utilization. Thus, the ratio can be optimized to achieve a desired balance of factors in order to fabricate particular semiconductor devices. A most preferred embodiment provides for an adjustable exhaust port 20.

The Group III compound gases, such as triethylgallium(TEGa), triethylaluminum, (TEAl) and the like, enter the chamber 10 through injection points, i.e., nozzles 14. The nozzles are in communicaation with a plurality of mixing chambers for the gas via ports 26 or passageways 32. Depending on the reactivity of the gases, the chambers will be jacketed, not illustrated, and cooled with water or other suitable medium. More particularly, each Group III compound growth composition mixture has a separate chamber.

For example, if growth of semiconductor devices, such as MESFET's or HEMT's were desired, then one chamber 24 would contain a source injecion line 22, for example, for the gas TEGa. The chamber 24 permits premixing of gas species such as the analogs trimethyl and triethyl gallium, i.e., TMGa and TEGa, with n-type and/or p-type dopants. The mixing chambers ensure a uniform distribution of Group III compounds and dopants across the surface of the substrate.

The uniformly mixed and distributed gas exits the chamber 24 via port 26 and toward the substrate(s) 300 through the nozzle 14. The number and size of the ports 26 and nozzles 14 associated therewith is a function of the area over which the gas mixture must be distributed at the substrate surface. The geometric arrangement and size of the nozzles to obtain a uniform layer is amplified hereinafter.

If it is desirable or advantageous to rapidly switch on and off different Group III compound materials, e.g., Al, entering the reaction chamber 10, then a second chamber for TEAl 30 with an inlet 28 containing an exhaust valve 36 to exhaust residual Al from the system when Al layers are not being grown is provided. The chamber 30 is in communication with the reaction chamber 10 via the ducts 32 containing the ports 34. The ducts 32 passing through chamber 24 enhance the mixing of the semiconductor gases and dopants, if any. As with the first mixing chamber 24, this second chamber 30 permits mixing different species or analogues of the same Group III compound. The embodiment illustrated in FIG. 2 includes an exhaust poppet valve 36 as a preferred embodiment. However, any other suitable exhaust means sufficient to preclude any residual gas from migrating into chamber 10 is suitable. If a plurality of chambers, i.e., greater than 2, are stacked, then only the last chamber, i.e., the one farthest from the substrate will have a poppet valve while the other chambers will have other suitable exhaust valves. Preferably, the chambers are fabricated in a unitary piece of a suitable non-reactive material such as stainless steel, corrosion resistant alloys and/or composites and the like. If required to prevent any premature reactions of the Group III compounds and/or dopants, the mixing chambers 24 and 30 can be cooled by suitable means known in the art such as water cooling and the like.

Although a one-for-one correspondence of outlets from the chambers 24 and 30 is illustrated, the exact number of outlets can be adjusted to optimize for the volatility of the Group III compound. For example, certain gases may require two outlets from chamber 30 for every outlet from chamber 24 and vice versa.

A top view of injection nozzles 26 and 34 is illustrated in FIG. 2. The nozzle pattern is uniformly distributed to permit the formatin of uniform Group IIi–V compound semiconductor layers on the substrate 300. The configuration and spacing is discussed further below. However, spacing between nozzles of about 1 inch with a nozzle size of about $\frac{1}{8}"$ is suitable for a chamber 10 having a volume of about 36 cubic inches and capable of depositing a semiconductor layer such as GaAs layer on six 2" wafers wherein the layer thickness is on the order of $\pm 5\%$.

The chambers, i.e., reaction chamber 10, and gas mixing chambers 24 and 30 are supported by the base support member 40. Returning to the reaction chamber 10, a source for the Group V compound, preferable in the form of $As_2$, is illustrated as 42. In this embodiment, source 42 is a tubular member having holes 42a and 42b therein. The tube 42 splits nozzles 14 into equal halves to maintain the uniformity of the gas distribution. The Group V compound injection source 42 is located to cause a uniform distribution of the gas.

The Group V compounds diffuse by molecular flow across the substrate plane. Thus, the Group V injection should be spaced to thoroughly mix with the Group III compounds at the surface of the heated substrate. Since gallium arsenide and the analogue derivatives, e.g., gallium arsenide phosphide, and gallium arsenide antiminide, are all combined by adjusting the concentration of the Group V compound, the amount of Group V compound is supplied in the desired ratio of the final product, e.g., gallium arsenide, and whatever the desired combination is for the semiconductor material $GaAs_xP_{1-x}$, $GaAs_ySb_{1-y}$, and the like.

Suitable sources of $As_2$ are thermally cracked $AsH_3$ and alkyl arsines, such as triethylarsine, (TEAs). TEAs is preferred because it is less toxic. These are supplied in excess because the Group III compounds are the rate limitors for the Group III-V reaction. However, the amount required is still about 20 times less than with the MOCVD technique. As the size of the chamber grows, the source 42 can have any uniform configuration such as, and the like. The source 42 should divide the nozzles 14 in a configuration which maintains a uniform number of nozzles 14 of each source of Group III compounds in each partition.

To further enhance the reaction and minimize deposition of unwanted memory causing materials within the reaction chamber 10, the substrates 300 are heated from behind by black body radiation through heaters 44. Thus, the gases which do not touch the heated substrate remain in their gaseous form or are swept out of the system by exhaust opening 20.

More particularly, Group III injection points, having angles of dispersion $\theta_{1a}$, $\theta_{1b}$, $\theta_{2a}$, $\theta_{2b}$ are located within the line of sight of a substrate. Preferably, the injection points, i.e., nozzles 14, and substrate 300 are oriented such that the line of sight of dispersion of the gases from the nozzles is perpendicular to the substrate.

The distance from the nozzles to the substrate is adjusted such that it is less than the mean free path of the gases at the specific vacuum conditions under which the apparatus is operated. This ensures that the apparatus operates in a molecular beam condition. By "mean free path" we mean the distance over which the reactant gas would travel without bumping into other molecules so as to react prior to hitting the heated substrate. Alternatively, a distance from the nozzle to the substrate is selected to optimize the dispersion pattern and the vacuum conditions are adjusted to achieve the necessary molecular flow conditions. The nozzle distance to substrate distance is further correlated with the injection and uniform dispersion of the Group V compounds, e.g., arsine, at the substrate surface.

The nozzle is configured to have an angle of dispersion to, preferably, coincide with an overlap of the placement of the substrate such that the substrate is exposed to the intersecting cross-sectional geometric configuration of the dispersion of the gases. Assuming the nozzle dispersion has a cone-like dispersion pattern with a density of particles decreasing from the center of the cone, then the nozzles and their placement are adjusted so that the algebraic sum of the fluxes (density of particles) from each nozzle remains constant across the surface of the substrate or area of the substrate upon which the uniform Group III-V compound semiconductor layers are to be deposited.

More specifically, the substrate is located at the intersection of the expanding cones of the dispersing gases as opposed to locating the subtrate in a non-intersecting portion of the expanding cones which would expose it solely a single reactive gas dispersion path. The exact uniform configuration of nozzles is a function of the area of deposition, the type of gas employed, the desired rate of growth, and the vacuum conditions. Any geometric pattern with alternating source nozzles for each Group III compound gas is most preferred.

The distance from the nozzles to the substrate is further adjusted such that the concentration of the reactant gases arriving at the heated substrate is high enough to achieve the desired growth rate at a predetermined flow rate. The illustrated apparatus is designed to deposit a layer with a thickness uniformity of ±5% or better and a doping profile uniformity of ±5% or better onto six 2" wafers.

Alternatively, the substrate can remain fixed and the flow rates can be varied to achieve the desired layer growth rate. It should be recognized that the injection of the Group III compound is adjusted to optimize utilization of these materials while minimizing the scattering. Thus, the area of intersecting circles of Group III compounds on the substrates, or other geometric configuration depending upon the nozzle shape, should be adjusted to optimize overlap and achievement of a uniform algebraic sum of all the fluxes from the nozzles aimed at a given substrate and also maximize materials utilization.

As with most growth procedures, there is a trade-off between uniformity and growth rate. Thus, the substrate is heated to a sufficient temperature to promote immediate reaction of the line of sight Group III compounds while not being so close as to permit non-uniform growth rates. In addition, the orifices are distributed so as to provide the most uniform semiconductor layer and doping profile to within ±5% or better and most preferably, better than ±1%.

Generally, the higher the temperature of the substrate, the more quickly the reaction proceeds. However, this is usually at the expense of layer grow rate because of material re-evaporation. Therefore, the temperature is generally adjusted to within the range of about 400°-800° C. and preferably, 500°-700° C. And most preferably, about 600° C. to about 650° C. Suitable vacuum conditions are less than $10^{-5}$ Torr and preferably $10^{-6}$ to $10^{-8}$ Torr.

More specifically, the apparatus is optimized for a particular device structure according to the following ratios and/or equations exemplified for a GaAs layer fabricated from TEGa and As$_2$ derived from thermally cracked AsH$_3$.

$$\frac{f_{As_2}}{f_{Ga}} = \frac{\Delta F}{2F_{Ga}} \times \frac{A}{a}$$

This ratio equation states that the As$_2$-to-Ga beam flux ratio is amplified over the AsH$_3$-to-TEGa flow ratio by the ratio of the deposition area to the exit orifice area. The lower case "f's" are beam fluxes of the subscripted material and the upper case "F's" are flow rates. "A" is the deposition are and "a" is the exhaust area. Preferably, this ratio is about 4%.

$$\lambda = kTV_b / \pi d_a^2 V_h P.$$

In this equation, $d_a$ is the average molecular diameter of the colliding molecules, $\lambda$ is the mean-free path, T is temperature, and the velocities of the "hot" and "beam" molecules are represented by $V_h$ and $V_b$, respectively. Calculating mean-free path for a given reaction chamber configuration enables the apparatus to be run under molecular flow conditions, i.e., MBE conditions, as desired. In other words, the height of the chamber, i.e., nozzle to substrate distance, must be smaller than the mean-free path, $\lambda$, of the Group III alkyl compounds but large enough to obtain a uniform distribution of Group V compounds at the substrate surface.

Finally, the change in pressure from side to side in the chamber must be small when compared to the pressure drop across the exit orifice. For a chamber that is as wide as it is long, the ratio of the conductance across the chamber $C_a$ to the conductance out $C_o$ is given by $$C_a/C_o = 4h^2/a$$

where "h" is the nozzle to substrate distance and "a" is the exit orifice area. Preferably, the Ca/Co ratio is 4. In other words, the pressure variation across the chamber is about 25% or less. Furthermore, the Group V compound, e.g., As$_2$, is supplied in sufficient exces to render this pressure variation insignificant.

A further embodiment of our growth process includes mounting of the substrate on a rotatable holder, such that it can be rotated through intersection of the circles at a rapid rate to provide alternating uniform layers of different semiconductor materials and/or conductivities. An additional benefit would be the fixed location of the substrate at the intersection of the dispersion patterns such that a uniform material is formed with the subsequent movement of the substrate to a different chamber which can be optimized for that specific layer growth without relation to the intersections of the other semiconductor metal organic gases being introduced into a given reaction chamber.

Having described the apparatus, the following procedure permits the fabrication of 960 wafers per week in a three-zone six-wafer per zone VCE apparatus to run two shifts per day. The process incorporates both valve switching, i.e., turning on and off reactant gases and position switching, i.e., moving the substrate through different reaction zones. More particularly, FIG. 3 shows a process sequence chart for MESFET epi-layer growth. Referring to these figures, a wafer tray would be loaded into the first zone and heated for about 15 minutes to 650° C. at $10^{-7}$ Torr, then rotated to the second zone where the undoped GaAs layer about $10^4$ Å thick would be deposited at a growth rate of about 2 microns per hour. The concentration of dopant impurities to the undoped layer should be $1 \times 10^{15}$ atoms/cm$^3$ or less. Next, this tray would move to the third position where the n-type active layer would be deposited. The n-type layer is about 2000 Å thick with an n-type dopant concentration of about $2 \times 10^{17}$ atmos/cm$^3$. The growth rate of the n-type layer is about 2 microns per hour. The tray is then rotated back into the first zone, cooled, and unloaded. Finally, source, drain and gate electrodes are applied by means known in the art. In this deposition process the second zone is a growth chamber dedicated exclusively to undoped material, and the third zone is a growth chamber dedicated exclusively to doped material. Note also that at any given time, three trays are being processed simultaneously.

The throughput of such a reactor can be estimated as follows. From experience, we expect that the cooling and heating times in the first (load-unload) zone will be about 15 minutes each. Thus, the tray advance time, $t_0$, will be 30 minutes. Optimally, the 1-micron thick undoped layer will be grown at 2 microns/hour in 30 minutes in Zone 2; and the n-type and n+-type GaAs layers will be grown in Zone 3 in approximately 15 minutes with a 15-minute no-growtH period (gallium off). Since the tray advance time is one-half hour, six wafers will come out every one-half hour. In continuous operation, one reactor will then produce 960 wafers per week running two shifts per day.

Having described a proposed MESFET production reactor, we now note that the addition of a controllable Al source in Zones 2 and 3 will allow the production of HEMT's. A process sequence for the production of HEMT's is shown in FIG. 4. The key to this process is the valve design. A viable valve concept is shown and described schematically in FIG. 1.

The heating and cooling times are substantially similar, i.e., about 15 minutes. The n-type layer is $10^4$ Å with an impurity concentration of about $1 \times 10^{15}$ atoms/cm$^3$. Thereafter, an undoped $Al_zGa_{1-z}As$ layer having a thickness of about 30 to 100 Å is grown followed by 5000 Å n+-type $Al_zGa_{1-z}As$ wherein Z is from 0.1 to 0.9 and preferably 0.2 to 0.3. The dopant concentratio is about $1 \times 10^{18}$ atoms/cm$^3$. Thereafter, about 1000 Å layer of n+-type GaAs, having an n-type dopant of also about $1 \times 10^{18}$ atoms/cm$^2$, is grown by terminating the flow of Al and exhausting the Al source chamber to avoid memory problems. Finally, after cooling, source, gate and drain electrodes are formed by methods known in the art.

Having described the general apparatus and process, those modifications obvious to the ordinary skilled artisan from a reading of the embodiments of the invention described herein are intended to be included within the scope of the invention.

What is claimed is:

1. A vacuum metal organic process for fabricating Group II-V compound semiconductor layers on a substrate comprising:
    orienting an injection block having a plurality of geometrically arranged injection sources for gaseous Group III metal organic compounds substantially perpendicular to the placement of one or a plurality of semiconductor wafer substrate(s) within a vacuum reaction chamber, said geometricaly arranged injection sources sized to provide a dispersing flow of said Group III compounds capable of depositing layer of about 5% uniform thickness or less over substantially the entire semiconductor wafer;
    locating centrally an injection source of a Group V compounds within said geometrically arranged injection sources for gaseous Group III metal organic compounds in said vacuum reaction chamber, said injection source sized to supply an excess of the Group V compounds required to react with the Group III compounds in order to form Group III-V semiconductor layers on the substrate and partition the Group III metal organic compound sources into groups having substantially equal numbers of injection sources;
    injecting an excess of the Group V compounds;
    adjusting the vacuum within the reaction chamber at the predetermined flow rates of the Group III compounds such that a mean-free path of the Group III compounds is greater than the distance from the injection source of the Group III compounds to the substrate; and
    heating the substrate to a temperature at which the reaction proceeds; and
    exhausting unreacted Group III compounds from said vacuum chamber, adjacent the edges of a substrate holder facing the top of said chamber opposite to said injection sources, wherein the dispersing flow of Group III compounds from the geometric arrangement of sources uniformly overlaps over the substantially entire substrate and the algebraic sum of the fluxes from the Group III compound injection sources remains constant across the area of the substrate upon which the Group III-V compound layer is to be deposited.

2. The process according to claim 1 wherein the Group V compound is obtained by thermally cracking a metal organic Group V compound and the substrates are preheated prior to entering the deposition area.

3. The process according to claim 2 wherein the process proceeds in the absence of a carrier gas for either the Group III or Group V compound.

4. The process according to claim 3 wherein the Group III compound source to substrate distance is less than 100% of the mean-free path at molecular flow conditions but large enough to obtain a uniform Group V compound concentration at the substrate surface sufficient to grow a Group III-V compound layer having a thickness variation of ±5% or less, and the ratio of conductance across the chamber to conductance out of the chamber, Ca/Co, is about 25% or less.

5. The process according to claim 4 wherein the Group V compound to Group III compound ratio is about 2:1.

6. The process of fabricating a MESFET semiconductor device by vacuum chemical epitaxy comprising:
    heating a crystalline GaAs substrate in a vacuum chamber having vacuum condition of from about $10^{-6}$ to about $10^{-8}$ Torr to a temperature of from about 500° C. to about 700° C. for a period of from about 5 minutes to about 20 minutes;
    depositing a layer of undoped GaAs having a thickness of from about $10^2$ to about $10^4$ Å;
    continuing to deposit said GaAs layer while introducing n-type dopants to create an n-type GaAs layer having a thickness of from about 1000 Å to about 3000 Å;
    adding additional n-type dopant to said vacuum chamber to grow an n+-type GaAs layer having a thickness of from about 500 Å to about 2500 Å;
    discontinuing the flow of gallium containing gas, arsine containing gas and n-type dopants while maintaining the substrate under vacuum conditions for from about 5 to about 20 minutes; and
    removing the substrate from the vacuum chemical epitaxy apparatus and fabricating source, gate, and drain electrical contacts thereto.

7. The process according to claim 6 wherein the vacuum is about $10^{-7}$ Torr, the temperature is about 650° C., the heating and discontinuing of gas flow steps are about 15 minutes, the undoped GaAs doner/acceptor concentration is about $1 \times 10^{15}$ atoms/cm$^3$ with a thickness of about $10^4$ Å, the n-type layer of GaAs has an n-type dopant concentration of about $2 \times 10^{17}$ atmos/cm$^3$ with a thickness of about 2000 Å, and the n$^+$-type GaAs layer having an n-type dopant concentration of about $2 \times 10^{18}$ atoms/cm$^3$ and thickness of about 1000 Å.

8. A process of fabricating an HEMT semiconductor device comprising:

placing a crystalline GaAs wafer within a vacuum chamber apparatus;

evacuating the apparatus to a vacuum condition of from about $10^{-6}$ Torr to about $10^{-8}$ torr;

heating the wafer to a temperature of about 650° C. $\pm 50°$ C. for a period of about 15 minutes $\pm 5$ minutes;

introducing a source of gallium and a source of arsine into the vacuum chamber so as to deposit a layer of about $10^4$ Å $\pm 1000$ Å thickness of undoped GaAs;

introducing a source of an aluminum containing compound so as to grow an undoped layer of Al$_z$Ga$_{1-z}$As having a thickness of between about 30° and about 100 Å having a doping concentration substantially similar to that of said undoped GaAs layer;

introducing a source of n$^+$-type dopant atoms to fabricate an n$^+$-type layer of Al$_z$Ga$_{1-z}$As having a thickness of about 500 Å $\pm 200$ Å and having a donor doping concentration of about $2 \times 10^{18}$ atoms/cm$^3$;

terminating the flow of the aluminum-containing compound so as to grow an n$^+$-type GaAs layer having a thickness of about 1000 Å $\pm 500$ Å;

terminating the source of said n-type dopants, said gallium source, and said arsine source;

maintaining the GaAs substrate within said vacuum chamber for about 15 minutes $\pm 5$ minutes;

and removing said GaAs substrate and fabricating source, gate, and drain electrodes thereto.

9. The process according to claim 8 wherein the vacuum is about $10^{-7}$ Torr, the temperature is about 650° C., the heating and maintaining steps are about 15 minutes, the undoped GaAs thickness is about $10^4$ Å, the n$^+$-type AlGaAs thickness is about 500 Å, the n$^+$-type GaAs and thickness is about 1000 Å.

* * * * *

UNITED STATES PATENT AND TRADEMARK OFFICE
CERTIFICATE OF CORRECTION

PATENT NO. : 4,829,021
DATED : May 9, 1989
INVENTOR(S) : FRAAS et al

It is certified that error appears in the above-identified patent and that said Letters Patent is hereby corrected as shown below:

Column 1, line 21, "Group III-IV" should read -- Group III-V --.
Column 2, line 31, "fro" should read --from--.
Column 3, line 10, "injecion" should read --injection--;
        line 62, "Group IIi-V" should read -- Group III-V --.
Column 6, line 33, "exces" should read --excess--.
Column 7, line 17, "no-growtH" should read --no-growth--;
        line 34, "5000 Å" should read --500 Å--;
        line 50, "Group II-V" should read -- Group III-V --;
        lines 57 and 58, "geometricaly" should read --geometrically--.
Column 9, line 17, "torr" should read --Torr--.
Column 10, line 21, "C." should read --C--.

Signed and Sealed this

Sixth Day of March, 1990

Attest:

JEFFREY M. SAMUELS

*Attesting Officer*      *Acting Commissioner of Patents and Trademarks*